US012543452B2

(12) United States Patent
Lee et al.

(10) Patent No.: US 12,543,452 B2
(45) Date of Patent: Feb. 3, 2026

(54) DISPLAY DEVICE

(71) Applicant: SAMSUNG DISPLAY CO., LTD., Yongin-si (KR)

(72) Inventors: Sunhwa Lee, Yongin-si (KR); Mukyung Jeon, Yongin-si (KR); Dohyun Kwon, Yongin-si (KR); Haseok Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 753 days.

(21) Appl. No.: 17/256,443

(22) PCT Filed: Oct. 16, 2018

(86) PCT No.: PCT/KR2018/012197
§ 371 (c)(1),
(2) Date: Dec. 28, 2020

(87) PCT Pub. No.: WO2020/013389
PCT Pub. Date: Jan. 16, 2020

(65) Prior Publication Data
US 2021/0273195 A1    Sep. 2, 2021

(30) Foreign Application Priority Data
Jul. 10, 2018    (KR) .................. 10-2018-0079959

(51) Int. Cl.
*H10K 59/123*    (2023.01)
*H10K 59/124*    (2023.01)
(Continued)

(52) U.S. Cl.
CPC ......... *H10K 59/123* (2023.02); *H10K 59/124* (2023.02); *H10K 59/80515* (2023.02);
(Continued)

(58) Field of Classification Search
CPC .. H10K 50/813; H10K 50/865; H10K 59/124; H10K 50/818; H10K 59/123
(Continued)

(56) References Cited

U.S. PATENT DOCUMENTS 6,426,787 B1 * 7/2002 Satake .............. G02F 1/133553
349/114
7,456,431 B2 * 11/2008 Um ........................ H10K 50/85
257/E27.111
(Continued)

FOREIGN PATENT DOCUMENTS

JP    2016119185 A    6/2016
KR    20060129552 A    12/2006
(Continued)

OTHER PUBLICATIONS

International Search Report mailed Apr. 9, 2019 for PCT/KR2018/012197.
Written Opinion mailed Apr. 9, 2019 for PCT/KR2018/012197.

*Primary Examiner* — Ori Nadav
(74) *Attorney, Agent, or Firm* — CANTOR COLBURN LLP

(57) ABSTRACT

Display apparatuses according to various embodiments are provided. A display apparatus according to an embodiment includes a substrate, a thin film transistor on the substrate, an organic insulating layer on the thin film transistor, a pixel electrode arranged on the organic insulating layer, wherein a central region, a peripheral region surrounding the central region, and a connection region adjacent to the peripheral region are defined on the pixel electrode, and the pixel electrode includes a protrusion arranged in the peripheral region and protruding toward the substrate and a via plug arranged in the connection region and electrically connected
(Continued)

to the thin film transistor, and a pixel definition layer exposing the central region of the pixel electrode.

16 Claims, 15 Drawing Sheets

(51) Int. Cl.
    *H10K 59/80*     (2023.01)
    *H10K 59/38*     (2023.01)
    *H10K 102/00*     (2023.01)

(52) U.S. Cl.
    CPC ........... *H10K 59/873* (2023.02); *H10K 59/38* (2023.02); *H10K 59/8792* (2023.02); *H10K 2102/3026* (2023.02)

(58) Field of Classification Search
    USPC .......................................................... 257/40
    See application file for complete search history.

(56) References Cited

U.S. PATENT DOCUMENTS

| | | | |
|---|---|---|---|
| 7,595,502 B2 * | 9/2009 | Suh | H10K 71/60 |
| | | | 257/40 |
| 7,649,311 B2 * | 1/2010 | Park | H10K 59/127 |
| | | | 313/506 |
| 7,915,613 B2 | 3/2011 | Park | |
| 9,874,778 B2 | 1/2018 | Bang et al. | |
| 2004/0251821 A1 | 12/2004 | Cok | |
| 2005/0023969 A1 | 2/2005 | Omata et al. | |
| 2005/0128401 A1 * | 6/2005 | Lee | G02F 1/134363 |
| | | | 349/139 |
| 2014/0332768 A1 | 11/2014 | Kwon et al. | |
| 2016/0155983 A1 * | 6/2016 | Lee | H10K 50/813 |
| | | | 257/40 |
| 2016/0181336 A1 | 6/2016 | Tokuda et al. | |
| 2019/0155098 A1 | 5/2019 | Song et al. | |

FOREIGN PATENT DOCUMENTS

| | | |
|---|---|---|
| KR | 100786295 B1 | 12/2007 |
| KR | 1020080001513 A | 1/2008 |
| KR | 1020080057789 A | 6/2008 |
| KR | 100919634 B1 | 9/2009 |
| KR | 100984362 B1 | 9/2010 |
| KR | 101318307 B1 | 10/2013 |
| KR | 20140133052 A | 11/2014 |
| KR | 20160015815 A | 2/2016 |
| KR | 1020160066112 A | 6/2016 |
| KR | 1020160142485 A | 12/2016 |
| KR | 1020170018130 A | 2/2017 |
| KR | 1020170038344 A | 4/2017 |

* cited by examiner

DISPLAY DEVICE

TECHNICAL FIELD

Various embodiments of the disclosure relate to a display apparatus, and more particularly, to a display apparatus in which the occurrence of a color band outside the display apparatus due to reflected light can be reduced.

BACKGROUND ART

A display apparatus may visually display image data. The display apparatus may include a thin film transistor and a light-emitting device. A pixel electrode of the light-emitting device may be connected to the thin-film transistor through a via plug penetrating through an insulating layer thereunder, and the upper surface of the via plug may have a concave shape according to a manufacturing process thereof.

SUMMARY

Due to the concave upper surface, more incident light in a particular direction may be reflected and a color band may occur outside the display apparatus. Embodiments of the disclosure are to provide a display apparatus providing high-quality images by reducing the occurrence of a color band. However, these problems are merely examples and the scope of the disclosure is not limited thereto.

According to an aspect, a display apparatus includes a substrate, a thin film transistor on the substrate, an organic insulating layer on the thin film transistor, a pixel electrode arranged on the organic insulating layer, where a central region, a peripheral region surrounding the central region, and a connection region adjacent to the peripheral region are defined on the pixel electrode, and the pixel electrode includes a protrusion arranged in the peripheral region and protruding toward the substrate and a via plug arranged in the connection region and electrically connected to the thin film transistor, and a pixel definition layer exposing the central region of the pixel electrode.

According to another aspect, a display apparatus includes a substrate, a thin film transistor on the substrate, an organic insulating layer covering the thin film transistor, wherein a central region, a peripheral region surrounding the central region, and a connection region adjacent to the peripheral region are defined on the organic insulating layer, and the organic insulating layer defines a recession arranged in the peripheral region and a via hole arranged in the connection region, and the via hole exposes a portion of an electrode electrically connected to the thin film transistor, a pixel electrode arranged on the central region, the peripheral region, and the connection region of the organic insulating layer, and a pixel definition layer exposing a central portion of the pixel electrode corresponding to the central region.

According to various embodiments of the disclosure, due to the concave upper surface corresponding to the protrusion arranged in the peripheral region of the pixel electrode or the recession arranged in the peripheral region of the organic insulating layer, the occurrence of a color band may be reduced by reducing the ratio of reflected light reflected from the concave upper surface corresponding to the via plug in the entire reflected light. A display apparatus providing a high-quality image due to a reduced color band may be implemented. However, the scope of the disclosure according to the invention is not limited to these effects.

DETAILED DESCRIPTION

Figure 1:
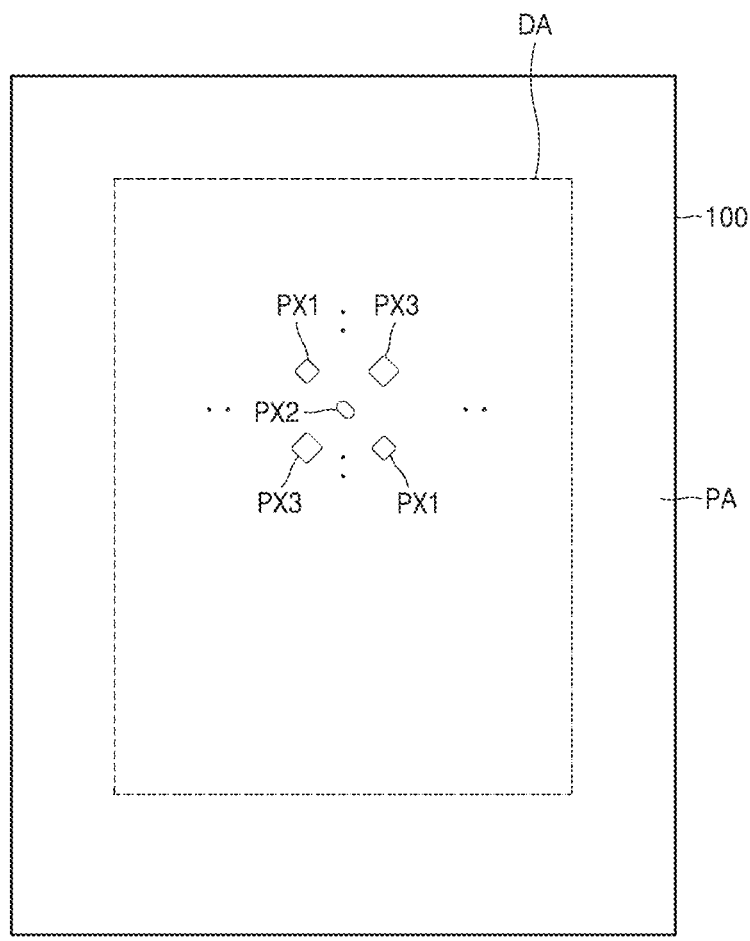
FIG. 1 is a schematic plan view of a display apparatus according to an embodiment.

The disclosure may be variously modified and may include various embodiments, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure according to the invention is not limited to the embodiments described below and may be embodied in various modes.

Hereinafter, embodiments of the disclosure will be described in detail with reference to the accompanying drawings. In order to clearly describe the disclosure, portions irrelevant to the description will be omitted, and in the following description with reference to the drawings, like reference numerals will denote like elements and redundant descriptions thereof will be omitted for conciseness It will be understood that although terms such as "first" and "second" may be used herein to describe various components, these components should not be limited by these terms and these terms are only used to distinguish one component from another component. As used herein, the singular forms "a," "an," and "the" are intended to include the plural forms as well, unless the context clearly indicates otherwise. When an element is referred to as being "connected" to another element, it may be "directly connected" to the other element or may be "electrically connected" to the other element with one or more intervening elements therebetween. When something is referred to as "including" a component, another component may be further included unless specified otherwise.

Sizes of components in the drawings may be exaggerated for easy understanding and convenience of description.

Also, modifications of the shapes illustrated in the drawings may be expected as a result of, for example, manufacturing techniques and/or tolerances. Thus, embodiments of the disclosure should not be construed as being limited to particular shapes of components illustrated in the drawings but should be understood as including changes in shapes resulting from, for example, manufacturing.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a schematic plan view of a display apparatus according to an embodiment.

Referring to FIG. 1, the display apparatus may include a display area DA capable of displaying an image and a non-display area PA outside the display area DA. It may be understood that a schematic plan view of a substrate 100 included in the display apparatus is illustrated in FIG. 1. The display area DA and the non-display area PA may be defined in the substrate 100.

Pixels that emit light of different colors may be arranged in the display area DA. For example, as illustrated in FIG. 1, first to third pixels PX1, PX2, and PX3 emitting red, green, and blue light respectively may be arranged on the display area DA. Although FIG. 1 illustrates a structure in which the first to third pixels PX1, PX2, and PX3 are arranged in a so-called diamond pentile type, the arrangement structure of pixels according to the invention may be variously modified.

Each of the pixels PX1, PX2, and PX3 may emit red, green, blue, or white light and may include, for example, an organic light-emitting diode. Each of the pixels PX1, PX2, and PX3 may include devices such as a thin-film transistor ("TFT") and a capacitor. An image may be displayed through the light emitted by the pixels PX1, PX2, and PX3, and the display area DA may be defined as an area in which the pixels PX1, PX2, and PX3 capable of emitting light are arranged.

Herein, the pixel PX may be a so-called subpixel that emits light of any one color of red, green, blue, and white.

The non-display area PA may be an area in which an image is not displayed, and drivers (e.g., a gate driver and a source driver) for providing electrical signals or power to pixels, driving voltage supply lines, and the like may be arranged therein and pads for electrically connecting electronic devices, a printed circuit board, and the like may be arranged therein.

Figure 2A:
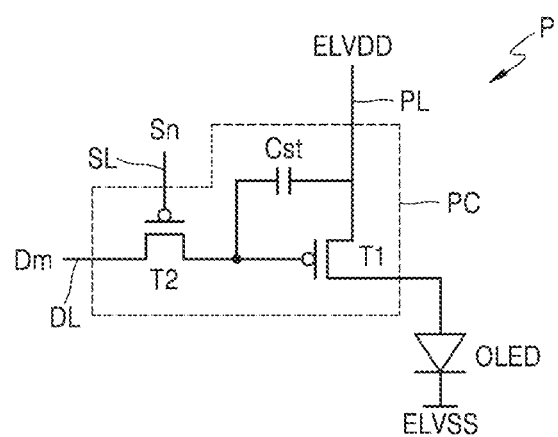
FIGS. 2A and 2B illustrate examples of an equivalent circuit diagram of a pixel of a display apparatus according to an embodiment, respectively.
Figure 2B:
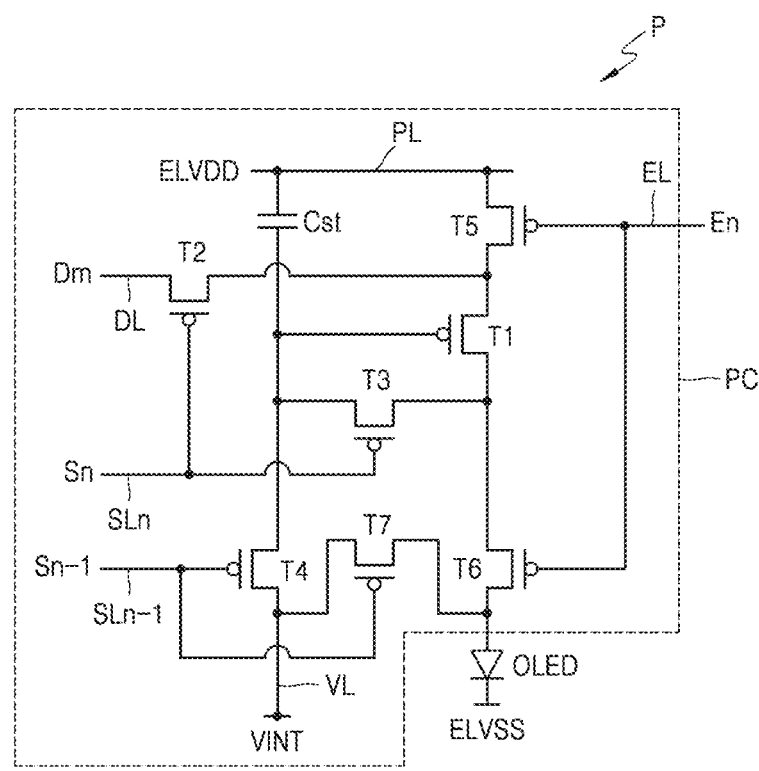

FIGS. 2A and 2B respectively illustrate examples of an equivalent circuit diagram of any one pixel of a display apparatus according to an embodiment.

Each pixel P may include a pixel circuit PC connected to a scan line SL and a data line DL and an organic light-emitting diode OLED connected to the pixel circuit PC. The pixel P may collectively refer to the first to third pixels PX1, PX2, and PX3 of FIG. 1.

Referring to FIG. 2A, the pixel circuit PC may include a driving TFT T1, a switching TFT T2, and a storage capacitor Cst. The switching TFT T2 may be connected to a scan line SL and a data line DL and may be configured to transmit a data voltage Dm input through the data line DL to the driving TFT T1 according to a scan signal Sn input through the scan line SL. The data voltage Dm may correspond to the brightness of light to be output by the organic light emitting diode OLED. Depending on the configuration of the pixel circuit PC and the conductivity type of the driving thin film transistor T1, the brightness of light emitted by the organic light emitting diode OLED may increase as the data voltage Dm decreases, and vice versa.

The storage capacitor Cst may be connected to the switching thin film transistor T2 and a driving voltage line PL and may store a voltage corresponding to the difference between the voltage received from the switching thin film transistor T2 and a first power voltage ELVDD (or driving voltage) applied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness corresponding to the data voltage Dm according to the driving current.

According to the embodiment illustrated in FIG. 2A, the pixel circuit PC may include two thin film transistors and one storage capacitor; however, the disclosure according to the invention is not limited thereto.

Referring to FIG. 2B, the pixel circuit PC may include a driving thin film transistor T1, a switching thin film transistor T2, a compensation thin film transistor T3, a first initialization thin film transistor T4, a first emission control thin film transistor T5, a second emission control thin film transistor T6, a second initialization thin film transistor T7, and a storage capacitor Cst. According to the embodiment illustrated in FIG. 2B, signal lines SLn, SLn-1, EL, and DL, an initialization voltage line VL, and a driving voltage line PL may be connected to each pixel P; however, the disclosure according to the invention is not limited thereto.

A gate electrode of the driving thin film transistor T1 may be connected to a first electrode of the storage capacitor Cst, a source electrode of the driving thin film transistor T1 may be electrically connected to the driving voltage line PL via the first emission control thin film transistor T5, and a drain electrode of the driving thin film transistor T1 may be electrically connected to an organic light emitting diode OLED via the second emission control thin film transistor T6. The driving thin film transistor T1 may receive a data voltage Dm through the switching thin film transistor T2 and the compensation thin film transistor T3, store, in the storage capacitor Cst, a voltage in which a threshold voltage of the driving thin film transistor T1 is compensated for in the data voltage Dm, and control a driving current to be output to the organic light emitting diode OLED based on the voltage stored in the storage capacitor Cst.

A gate electrode of the switching thin film transistor T2 may be connected to a first scan line SL and a source electrode thereof may be connected to a data line DL. A drain electrode of the switching thin film transistor T2 may be connected to the source electrode of the driving thin film transistor T1. The switching thin film transistor T2 may be turned on in response to a first scan signal Sn received through the first scan line SL and may transmit the data voltage Dm input through the data line DL to the source electrode of the driving thin film transistor T1.

A gate electrode of the compensation thin film transistor T3 may be connected to a first scan line SLn, a source electrode of the compensation thin film transistor T3 may be connected to the drain electrode of the driving thin film transistor T1, and a drain electrode of the compensation thin film transistor T3 may be commonly connected to the first electrode of the storage capacitor Cst, a source electrode of the first initialization thin film transistor T4, and the gate electrode of the driving thin film transistor T1. The compensation thin film transistor T3 may be turned on in response to the first scan signal Sn received through the first scan line SL and may electrically connect the gate electrode and the drain electrode of the driving thin film transistor T1 to each other to diode-connect the driving thin film transistor T1.

A gate electrode of the first initialization thin film transistor T4 may be connected to a second scan line SLn-1 (a previous scan line). A drain electrode of the first initialization thin film transistor T4 may be connected to the initialization voltage line VL, and the source electrode of the first initialization thin film transistor T4 may be commonly connected to the first electrode of the storage capacitor Cst, the drain electrode of the compensation thin film transistor T3, and the gate electrode of the driving thin film transistor T1. The first initialization thin film transistor T4 may be turned on in response to a second scan signal Sn-1 received through the second scan line SLn-1 and may initialize the voltage of the gate electrode of the driving thin film transistor T1 to an initialization voltage VINT by transmitting the initialization voltage VINT to the gate electrode of the driving thin film transistor T1. The driving thin film transistor T1 to the gate electrode of which the initialization voltage VINT is applied may be fully turned on, and a hysteresis characteristic of registering a previously-output driving current may be removed.

A gate electrode of the first emission control thin film transistor T5 may be connected to an emission control line EL, a source electrode of the first emission control thin film transistor T5 may be connected to the driving voltage line PL, and a drain electrode of the first emission control thin film transistor T5 may be connected to the source electrode of the driving thin film transistor T1.

A gate electrode of the second emission control thin film transistor T6 may be connected to the emission control line EL, a source electrode of the second emission control thin film transistor T6 may be connected to the drain electrode of the driving thin film transistor T1, and a drain electrode of the second emission control thin film transistor T6 may be electrically connected to an anode electrode of the organic light emitting diode OLED. The first emission control thin film transistor T5 and the second emission control thin film transistor T6 may be simultaneously turned on according to an emission control signal En received through the emission control line EL, such that a current path passing through the driving thin film transistor T1 may be formed between the driving voltage line PL and the organic light emitting diode OLED and thus the driving current generated in the driving thin film transistor T1 may flow in the organic light emitting diode OLED.

A gate electrode of the second initialization thin film transistor T7 may be connected to the second scan line SLn-1, a source electrode of the second initialization thin film transistor T7 may be connected to the anode electrode of the organic light emitting diode OLED, and a drain electrode of the second initialization thin film transistor T7 may be connected to the initialization voltage line VL. The second initialization thin film transistor T7 may be turned on in response to the second scan signal Sn-1 received through the second scan line SLn-1 and may apply the initialization voltage VINT to the anode electrode of the organic light emitting diode OLED. By applying the initialization voltage VINT to the anode electrode of the organic light emitting diode OLED, the charge stored in a parasitic capacitor of the organic light emitting diode OLED may be removed.

According to the embodiment of FIG. 2B, both the gate electrode of the first initialization thin film transistor T4 and the gate electrode of the second initialization thin film transistor T7 may be connected to the second scan line SLn-1; however, the disclosure according to the invention is not limited thereto. According to another embodiment, the gate electrode of the first initialization thin film transistor T4 may be connected to the second scan line SLn-1 to drive based on the second scan signal Sn-1, and the second initialization thin film transistor T7 may be connected to a separate signal line (e.g., a next scan line) to be driven according to the scan signal transmitted through the corresponding scan line.

A second electrode of the storage capacitor Cst may be connected to the driving voltage line PL. The first electrode of the storage capacitor Cst may be commonly connected to the gate electrode of the driving thin film transistor T1, the drain electrode of the compensation thin film transistor T3, and the source electrode of the first initialization thin film transistor T4, and a voltage compensated for a threshold voltage of the driving thin film transistor T1 from the data voltage Dm may be applied thereto in response to the first scan signal Sn.

A cathode electrode (e.g., an opposite electrode) of the organic light emitting diode OLED may be provided with a second power voltage ELVSS (or a common power voltage). The organic light emitting diode OLED may emit light with the brightness corresponding to the driving current supplied from the driving thin film transistor T1.

The pixel circuit PC according to the invention is not limited to the number and circuit design of the thin film transistors and storage capacitor described with reference to FIGS. 2A and 2B, and the number and circuit design thereof may be variously modified in another embodiment.

Figure 3:
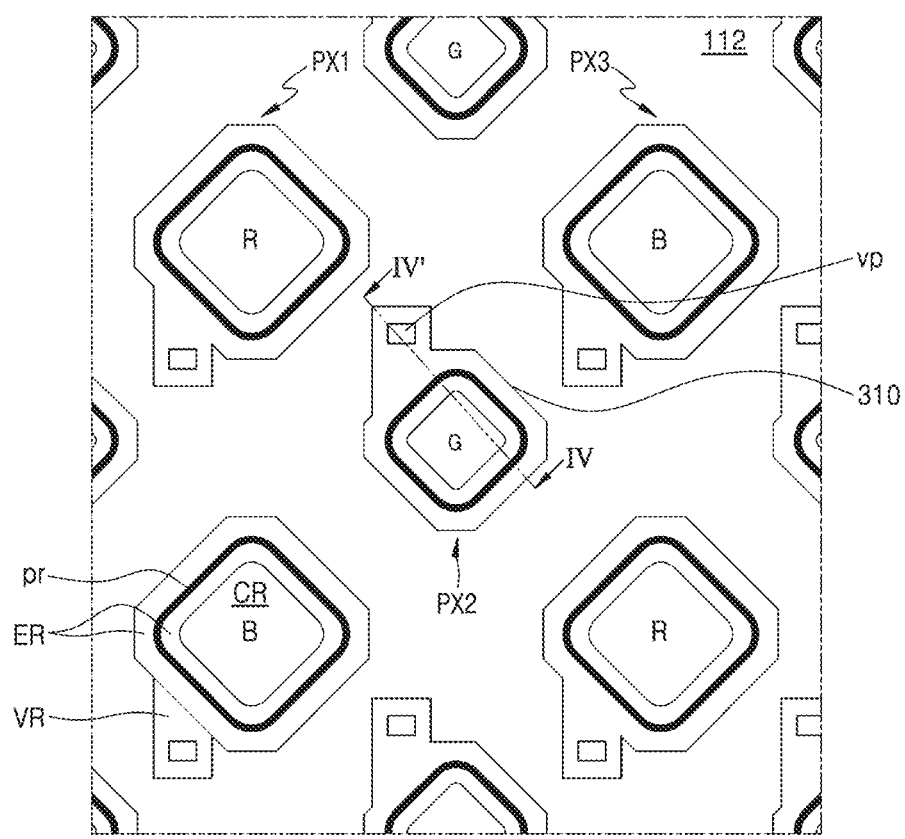
FIG. 3 is an enlarged schematic plan view of a portion of a display area of a display apparatus according to an embodiment.

FIG. 3 is an enlarged schematic plan view of a portion of a display area of a display apparatus according to an embodiment.

Referring to FIGS. 1 and 3, the first to third pixels PX1, PX2, and PX3 may be arranged in a so-called diamond pentile type. The diamond pentile type may be a type in which the first and second pixels PX1 and PX2 are alternately arranged in a diagonal direction and the second and third pixels PX2 and PX3 are alternately arranged in another diagonal direction as illustrated in FIGS. 1 and 3. Each of the first pixel PX1 and the third pixel PX3 may be located at the center of four second pixels PX2 adjacent to each other and located substantially in a square shape.

For easy understanding, FIG. 3 illustrates an organic insulating layer 112 and a pixel electrode 310 on the organic insulating layer 112. Components other than the organic insulating layer 112 and the pixel electrode 310 will be described in more detail with reference to FIG. 4. Although not illustrated in FIG. 3, the organic insulating layer 112 may be arranged on a thin film transistor arranged on a substrate. The thin film transistor may be arranged in a thin film transistor layer, and the thin film transistor may be arranged between the substrate and the organic insulating layer 112.

As illustrated in FIG. 3, a central region CR, a peripheral region ER surrounding the central region CR, and a connection region VR adjacent to the peripheral region ER may be defined.

According to an example, the central region CR, the peripheral region ER, and the connection region VR may be defined as some areas of the pixel electrode 310. According to another example, the central region CR, the peripheral region ER, and the connection region VR may be defined as some areas of the organic insulating layer 112. A background region not overlapping the central region CR, the peripheral region ER, and the connection region VR in the plan view may be additionally defined in the organic insulating layer 112. The central region CR, the peripheral region ER, and the connection region VR of the organic insulating layer 112 may correspond to the central region CR, the peripheral region ER, and the connection region VR of the pixel electrode 310, respectively.

The pixel electrode 310 may include a protrusion pr arranged in the peripheral region ER and protruding toward the substrate and a via plug vp arranged in the connection region VR and electrically connected to the thin film transistor. The protrusion pr may protrude downward from the lower surface of the pixel electrode 310. The lower surface of the pixel electrode 310 may be a surface facing the substrate 100 or a surface contacting the organic insulating layer 112. The via plug vp may be electrically connected to the thin film transistor under the organic insulating layer 112 by penetrating the organic insulating layer 112.

As illustrated in FIG. 3, when viewed in the vertical direction (z direction) (that is, the plan view), the protrusion pr may have a ring shape surrounding the central region CR. Herein, the ring shape may be determined corresponding to the planar shape of the central region CR and is not limited to a circle. The protrusion pr may extend along a center line of the peripheral region ER and may form a closed curve as illustrated in FIG. 3.

According to another example, the organic insulating layer 112 may include a recession arranged in the peripheral region ER and a via hole defined in the connection region VR and exposing a portion of an electrode electrically connected to the thin film transistor. A portion of the pixel electrode 310 filling the recession may correspond to the protrusion pr, and a portion of the pixel electrode 310 filling the via hole may correspond to the via plug vp. The recession may be a portion that is recessed from the upper surface of the organic insulating layer 112 toward the substrate 100. The recession may include a trench having a ring shape surrounding the central region CR when viewed in the vertical direction (z direction), and the protrusion pr filling the trench may have a ring shape when viewed in the vertical direction (z direction), as illustrated in FIG. 3.

Figure 4:
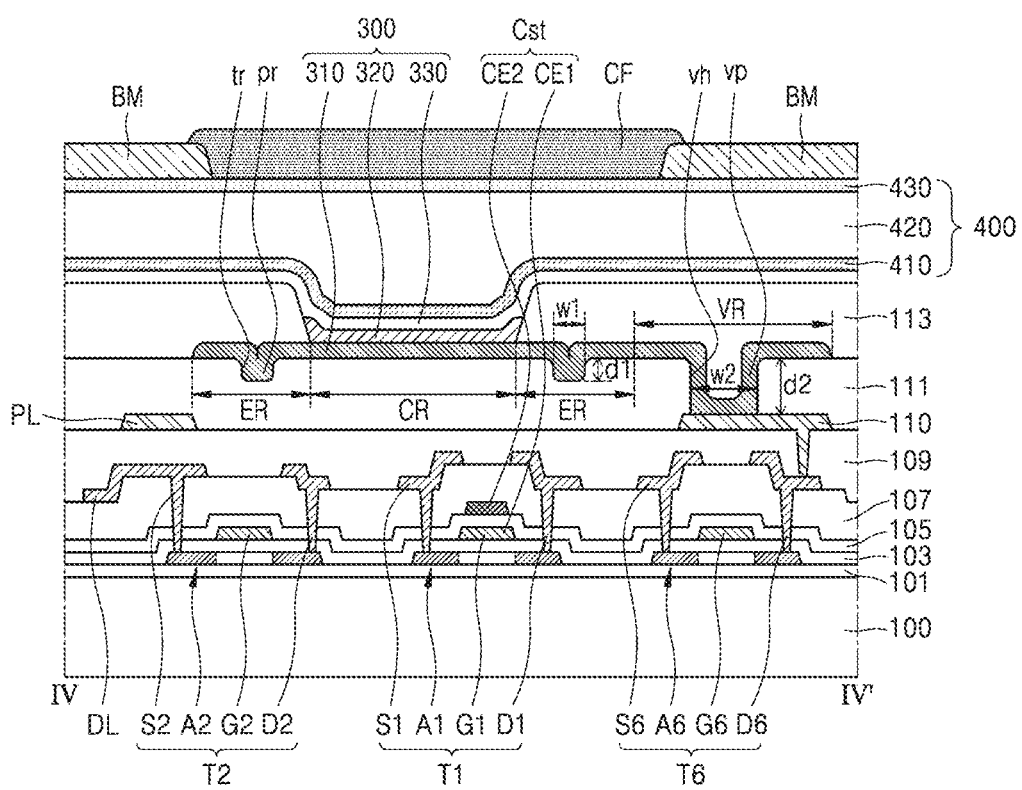
FIG. 4 is a cross-sectional view of a display apparatus according to an embodiment, for example, a cross-sectional view thereof taken along line IV-IV' of FIG. 3.

FIG. 4 is a cross-sectional view of a display apparatus according to an embodiment, for example, a cross-sectional view thereof taken along line IV-IV' of FIG. 3. The cross-sectional view of FIG. 4 illustrates a pixel of the pixel circuit PC described with reference to FIG. 2B. In FIG. 4, descriptions will be made according to the stacking order for easy understanding and convenience of description.

Referring to FIGS. 3 and 4, a buffer layer 101 may be arranged on a substrate 100. The substrate 100 may be formed of or include various materials such as glass materials or plastic materials such as polyethylene terephthalate ("PET"), polyethylene naphthalate ("PEN"), and polyimide. When the substrate 100 is formed of a plastic material, the flexibility of the display apparatus may be improved. The buffer layer 101 formed of silicon oxide (SiOx), silicon nitride (SiNx), and/or the like may be arranged on the substrate 100 to prevent the penetration of impurities thereinto.

First, second, and sixth thin film transistors T1, T2, and T6 and a storage capacitor Cst may be arranged on the buffer layer 101. The first, second, and sixth thin film transistors T1, T2, and T6 may include first, second, and sixth semiconductor layers A1, A2, and A6, respectively, and first, second, and sixth gate electrodes G1, G2, and G6, respectively.

A first gate insulating layer 103 may be arranged between the first, second, and sixth semiconductor layers A1, A2, and A6 and the first, second, and sixth gate electrodes G1, G2, and G6. The first gate insulating layer 103 may be formed of or include an inorganic insulating material such as silicon oxide (SiOx), silicon nitride (SiNx), or silicon oxynitride (SiON).

The first, second, and sixth semiconductor layers A1, A2, and A6 may be formed of or include polysilicon. The first semiconductor layer A1 may include a first channel region overlapping the first gate electrode G1 and not being doped with impurities and a first source region and a first drain region located on both sides of the first channel region and doped with impurities. A first source electrode S1 and a first drain electrode D1 may be connected to the first source region and the first drain region, respectively. The second semiconductor layer A2 may include a second channel region overlapping the second gate electrode G2 and not doped with impurities and a second source region and a second drain region located on both sides of the second channel region and doped with impurities. A second source electrode S2 and a second drain electrode D2 may be connected to the second source region and the second drain region, respectively. The sixth semiconductor layer A6 may include a sixth channel region overlapping the sixth gate electrode G6 and not doped with impurities and a sixth source region and a sixth drain region located on both sides of the sixth channel region and doped with impurities. A sixth source electrode S6 and a sixth drain electrode D6 may be connected to the sixth source region and the sixth drain region, respectively.

The first, second, and sixth gate electrodes G1, G2, and G6 may include at least one of molybdenum (Mo), aluminum (Al), copper (Cu), and titanium (Ti) and may include a single layer or a multiple layer. According to an example, the first, second, and sixth gate electrodes G1, G2, and G6 may include a molybdenum (Mo) layer.

As illustrated in FIG. 4, the storage capacitor Cst may be arranged to overlap the first gate electrode G1 of the first thin film transistor T1 in the plan view. In this case, the area of the storage capacitor Cst and the first thin film transistor T1 may increase and a high-quality image may be provided. For example, the first gate electrode G1 may be a first electrode CE1 of the storage capacitor Cst. A second electrode CE2 may overlap the first electrode CE1 in the plan view, and a second gate insulating layer 105 may be arranged between the first electrode CE1 and the second electrode CE2. The second gate insulating layer 105 may be formed of or include an inorganic insulating material such as silicon oxide (SiOx), silicon nitride (SiNx), or silicon oxynitride (SiON).

An interlayer insulating layer 107 may be arranged on the first, second, and sixth semiconductor layers A1, A2, A6, the first, second, and sixth gate electrodes G1, G2, and G6, and the storage capacitor Cst. The interlayer insulating layer 107 may be formed of or include an inorganic insulating material such as silicon oxynitride (SiON), silicon oxide (SiOx), and/or silicon nitride (SiNx). A data line DL may be arranged on the interlayer insulating layer 107, and the data line DL may be connected to the second semiconductor layer A2 of the second thin film transistor T2 through a contact plug penetrating the interlayer insulating layer 107. A portion of the data line DL may function as the second source electrode S2 of the second thin film transistor T2. Moreover, the first, second, and sixth source electrodes S1, S2, and S6 and the first, second, and sixth drain electrodes D1, D2, and D6 may be arranged on the interlayer insulating layer 107 and may be connected to the first, second, and sixth semiconductor layers A1, A2, and A6 through contact plugs penetrating the interlayer insulating layer 107.

The first, second, and sixth thin film transistors T1, T2, and T6 may include the first, second, and sixth semiconductor layers A1, A2, and A6, respectively, the first, second, and sixth gate electrodes G1, G2, and G6, respectively, the first, second, and sixth source electrodes S1, S2, and S6, respectively, and the first, second, and sixth drain electrodes D1, D2, and D6, respectively. The first, second, and sixth thin film transistors T1, T2, and T6 and the insulating layers 103, 105, and 107 may be collectively referred to as a thin film transistor layer including the thin film transistors T1, T2, and T6.

According to an example, a driving voltage line PL may be arranged on a different layer from the data line DL. Herein, "A and B are arranged on different layers" may mean that at least one insulating layer is arranged between A and B such that one of A and B is arranged under the at least one insulating layer and the other one thereof is arranged over the at least one insulating layer. A first organic insulating layer 109 may be arranged between the driving voltage line PL and the data line DL, and the driving voltage line PL may be covered with a second organic insulating layer 111.

The driving voltage line PL may include a single layer or multiple layers including at least one of aluminum (Al), copper (Cu), titanium (Ti), and any alloy thereof. According to an example, the driving voltage line PL may include a triple layer of Ti/Al/Ti. In FIG. 4, the driving voltage line PL is arranged on the first organic insulating layer 109; however, the disclosure according to the invention is not limited thereto. According to another example, the driving voltage line PL may be disposed in the same layer as the data line DL, and the first organic insulating layer 109 and the second organic insulating layer 111 may be formed as a single organic insulating layer. According to another example, the driving voltage line PL may include a first driving voltage line on the first organic insulating layer 109 and a second driving voltage line on the same layer as the data line DL electrically connected to the first driving voltage line and thus the resistance of the driving voltage line PL may be reduced.

A connection electrode 110 may be arranged on the first organic insulating layer 109 to electrically connect the thin film transistor (e.g., the sixth thin film transistor T6) to a pixel electrode 310. The connection electrode 110 may be connected to the sixth drain electrode D6 by penetrating the first organic insulating layer 109. According to another example, the pixel electrode 310 may be connected to the sixth drain electrode D6 by penetrating the first and second organic insulating layers 109 and 111, and in this case, the connection electrode 110 may be removed.

The second organic insulating layer 111 may be arranged on the driving voltage line PL and the connection electrode 110. The second organic insulating layer 111 may provide a flat lower surface to the pixel electrode 310 and may be formed of or include an organic material. For example, the organic material may include a general-purpose polymer such as polymethylmethacrylate ("PMMA") or polystyrene ("PS"), a polymer derivative having a phenolic group, an acrylic polymer, an arylether-based polymer, an amide-based polymer, a fluorine-based polymer, a p-xylene-based polymer, a vinyl alcohol-based polymer, or any blend thereof. The first organic insulating layer 109 may also be formed of or include an organic material like the second organic insulating layer 111. According to another example, the first organic insulating layer 109 may be formed of or include an inorganic material such as silicon oxynitride (SiON), silicon oxide (SiOx), and/or silicon nitride (SINx).

The organic insulating layer 112 of FIG. 3 may correspond to the second organic insulating layer 111. According to another example, when the first and second organic insulating layers 109 and 111 are formed as a single organic insulating layer, the single organic insulating layer may correspond to the organic insulating layer 112 of FIG. 3.

A central region CR, a peripheral region ER surrounding the central region CR, and a connection region VR adjacent to the peripheral region ER may be defined in the second organic insulating layer 111. The peripheral region ER may directly surround the vertical central region CR when viewed from the horizontal plane, that is, in the vertical direction (z direction), and the connection region VR may be directly adjacent to the peripheral region ER when viewed from the horizontal plane, that is, in the vertical direction (z direction). The pixel electrode 310 may be arranged only on the central region CR, the peripheral region ER, and the connection region VR of the second organic insulating layer 111, and a region where the pixel electrode 310 is not arranged may be referred to as a base region. The base region may be defined as a region not overlapping the central region CR, the peripheral region ER, and the connection region VR.

An organic emission layer that is at least a portion of an intermediate layer 320 may be arranged on the central region CR, and the central region CR may be defined by an opening in a pixel definition layer 113 exposing a central portion of the pixel electrode 310 and may correspond to a region that actually emits light. The size of the central region CR may be different for each of the first to third pixels PX1 to PX3. For example, the area of the central region CR of the third pixel PX may be largest and the area of the central region CR of the second pixel PX may be smallest. Although FIG. 3 illustrates that the planar shape of the central region CR is the shape of a square with rounded corners, this is merely an example and it may have various planar shapes such as a hexagonal or octagonal shape with rounded corners and a circular or elliptical shape.

The peripheral region ER may be defined as an area surrounding the central region CR with a substantially constant thickness. The pixel electrode 310 and the pixel definition layer 113 may overlap each other on the peripheral region ER. For example, the width of the peripheral region ER may be between about 1 micrometers (µm) and about 5 µm. For example, the width of the peripheral region ER may be between about 2 µm and about 4 µm. The pixel electrode 310 and the pixel definition layer 113 may overlap each other also on the connection region VR. The boundary between the connection region VR and the peripheral region ER may not be clear. The connection region VR may be a portion extending outward from the peripheral region ER and may be a region where a via hole vh is defined in the second organic insulating layer 111.

A via hole vh exposing a portion of the connection electrode 110 may be defined in the connection region VR of the second organic insulating layer 111. The connection electrode 110 may be connected, for example, to the sixth drain electrode D6 of the sixth thin film transistor T6.

As illustrated in FIG. 4, a trench tr may be defined in the peripheral region ER of the second organic insulating layer 111. The trench tr may be referred to as a recession. A protrusion pr may be a portion of the pixel electrode 310 filling the trench tr, and the trench tr may be in a ring shape surrounding the central region CR corresponding to the protrusion pr of FIG. 3.

A depth d1 of the trench tr may be equal to or smaller than a depth d2 of the via hole vh. Because the via hole vh penetrates the second organic insulating layer 111, the depth d2 of the via hole vh may be substantially equal to the thickness of the second organic insulating layer 111. For example, the depth d1 of the trench tr may be about half of the depth d2 of the via hole vh. For example, when the depth d2 of the via hole vh, that is, the thickness of the second organic insulating layer 111, is between about 1 μm and about 2 μm, the depth d1 of the trench tr may be between about 0.5 μm and about 1 μm. For example, when the depth d2 of the via hole vh, that is, the thickness of the second organic insulating layer 111, is about 1.5 μm, the depth d1 of the trench tr may be between about 0.5 μm and about 1 μm. The trench tr having the depth d1 less than the depth d2 of the via hole vh may be defined together, for example, when forming the via hole vh by using a halftone mask or a slit mask.

A width w1 of the trench tr may be less than a width w2 of the via hole vh. The width w1 of the trench tr may be about 2 μm or less. The width w1 of the trench tr may be, for example, between about 0.4 μm and about 1.6 μm. The width w1 may vary depending on the arrangement of the trench tr. For example, when a plurality of trenches is defined in the peripheral region ER as illustrated in FIGS. 6B and 6C, the widths of the respective trenches may be different from each other. As illustrated in FIG. 3, when one ring-shaped trench tr is arranged in the peripheral region ER, the trench tr may be arranged along a center line of the peripheral region ER.

An organic light emitting device 300 may be arranged on the second organic insulating layer 111, and the organic light emitting device 300 may include a pixel electrode 310, an opposite electrode 330, and an intermediate layer 320 including an organic emission layer between the pixel electrode 310 and the opposite electrode 330. A pixel definition layer 113 may be arranged on the pixel electrode 310. The pixel definition layer 113 may define an opening exposing the central region CR of the pixel electrode 310. The pixel definition layer 113 may prevent the occurrence of an arc between the edge of the pixel electrode 310 and the opposite electrode 330. The pixel definition layer 113 may be formed of or include, for example, an organic material such as polyimide or hexamethyldisiloxane ("HMDSO").

A central region CR, a peripheral region ER, and a connection region VR may also be defined in the pixel electrode 310 as in the second organic insulating layer 111. The central region CR, the peripheral region ER, and the connection region VR defined on the pixel electrode 310 may be substantially equal to the central region CR, the peripheral region ER, and the connection region VR defined on the second organic insulating layer 111, respectively. The opening in the pixel definition layer 113 may define the central region CR of the pixel electrode 310. That is, the central region CR may be defined as a partial region of the pixel electrode 310 that does not overlap the pixel definition layer 113.

The pixel electrode 310 may be directly arranged on the second organic insulating layer 111. According to another example, a layer such as a thin inorganic insulating layer may be arranged between the pixel electrode 310 and the second organic insulating layer 111, but the shape of the lower surface of the pixel electrode 310 may be determined corresponding to the shape of the upper surface of the second organic insulating layer 111. The pixel electrode 310 may include a protrusion pr corresponding to the trench tr of the second organic insulating layer 111 and a via plug vp corresponding to the via hole vh in the second organic insulating layer 111. The protrusion pr may be a portion of the pixel electrode 310 that at least partially fills the trench tr of the second organic insulating layer 111, and the via plug vp may be a portion of the pixel electrode 310 that at least partially fills the via hole vh in the second organic insulating layer 111. Because the pixel electrode 310 has a substantially constant thickness, the upper surface corresponding to the protrusion pr and the via plug vp may be concave as illustrated in FIG. 4.

The protrusion height of the protrusion pr may be substantially equal to the depth d1 of the trench tr, and the protrusion height of the via plug vp may also be substantially equal to the depth d2 of the via hole vh. The protrusion height of the protrusion pr may be equal to or smaller than the protrusion height of the via plug vp. For example, the protrusion height of the protrusion pr may be about half of the protrusion height of the via plug vp.

The intermediate layer 320 may include a low molecular weight or high molecular weight material. When the intermediate layer 320 includes a low molecular weight material, the intermediate layer 320 may include a structure in which a hole injection layer ("HIL"), a hole transport layer ("HTL"), an emission layer ("EML"), and an electron transport layer ("ETL"), an electron injection layer ("EIL"), and the like are stacked in a single or complex structure and may include various organic materials such as copper phthalocyanine (CuPc), N,N'-di(naphthalene-1-yl)-N, N'-diphenyl-benzidine ("NPB"), and tris-8-hydroxyquinoline aluminum (Alq3). These layers may be formed by vacuum deposition.

When the intermediate layer 320 includes a high molecular weight material, the intermediate layer 320 may generally have a structure including a hole transport layer (HTL) and an emission layer (EML). In this case, the hole transport layer may include poly(3,4-ethylenedioxythiophene) ("PEDOT") and the emission layer may include a high molecular weight material such as poly-phenylenevinylene ("PPV") and polyfluorene. The structure of the intermediate layer 320 according to the invention is not limited thereto and it may have various structures. For example, the intermediate layer 320 may include an integral layer over all of the pixel electrodes 310 or may include a patterned layer on the central region CR of the pixel electrode 310 to correspond to each of the pixel electrodes 310. For example, the emission layer may be arranged to cover the central region CR of the pixel electrode 310 exposed by the pixel definition layer 113.

The opposite electrode 330 may be arranged on a display area DA and may be arranged to cover the display area DA. That is, the opposite electrode 330 may be integrally formed to function as a cathode electrode of all of the organic light emitting devices 300.

The organic light emitting device 300 may be easily damaged by the moisture or oxygen from the outside and therefore may be protected by being covered with a thin film encapsulation layer 400. The thin film encapsulation layer 400 may cover the display area DA and extend to the outside of the display area DA. The thin film encapsulation layer 400 may include at least one organic layer and at least one inorganic layer. For example, the thin film encapsulation layer 400 may include a first inorganic layer 410, an organic layer 420, and a second inorganic layer 430.

The first inorganic layer 410 may cover the opposite electrode 330 and may include silicon oxide, silicon nitride, and/or silicon trioxynitride. Although not illustrated, other layers such as a capping layer may be arranged between the first inorganic layer 410 and the opposite electrode 330 when necessary. The organic layer 420 may cover the first inorganic layer 410 and may have a flat upper surface unlike the first inorganic layer 410. Particularly, the upper surface of the organic layer 420 may be substantially flat in the display area DA. The organic layer 420 may include at least one of polyethylene terephthalate, polyethylene naphthalate, polycarbonate, polyimide, polyethylene sulfonate, polyoxymethylene, polyarylate, and hexamethyldisiloxane. The second inorganic layer 430 may cover the organic layer 420 and may include silicon oxide, silicon nitride, and/or silicon trioxynitride.

Even when a crack occurs in the thin film encapsulation layer 400 through the above multilayer structure, such a crack may not be connected between the first inorganic layer 410 and the organic layer 420 or between the organic layer 420 and the second inorganic layer 430. Accordingly, the formation of a path through which the moisture or oxygen from the outside penetrates into the display area DA may be prevented or minimized.

According to an embodiment, a black matrix BM and a color filter CF may be arranged on the thin film encapsulation layer 400. The black matrix BM may absorb or block the light input from the outside, and the color filter CF may selectively transmit the light emitted from the intermediate layer 320 depending on the wavelength or color thereof.

The black matrix BM may at least partially overlap the via plug vp of the pixel electrode 310 in the plan view. The black matrix BM may overlap the connection region VR. The black matrix BM may define an opening exposing the central region CR, and the light emitted from the organic light emitting device 300 may be output through the opening to the outside. The opening in the black matrix BM may be filled by the color filter CF.

The black matrix BM may include various materials such as an organic material mixed with black pigment, chromium (Cr), or chromium oxide (CrOx). When the black matrix BM is formed of or include chromium or chromium oxide, the black matrix BM may include a single layer or a multiple layer of chromium or chromium oxide.

When the black matrix BM is arranged on the thin film encapsulation layer 400, the reflection of the external light may be sufficiently prevented even without a polarization layer having a thickness of about 100 μm, and thus, the flexibility thereof may be improved. Also, because it has a higher transmittance than the polarization layer, the contrast and light efficiency thereof may be improved.

The color filter CF may overlap the central region CR in the plan view. The color filter CF may substantially overlap the central region CR and the peripheral region ER. The color filter CF may be arranged to fill the opening in the black matrix BM. The color filter CF may include a coloring material and an organic material in which a coloring material is dispersed, wherein the coloring material may include a general pigment or dye and the organic material may include a general dispersant.

When white light is emitted from the organic light emitting device 300, the color filter CF may selectively transmit only light of a particular wavelength, such as red, green, or blue light and absorb light of the other wavelengths such that each pixel may emit light of one of red light, green light, and blue light. When visible light having a certain color, for example, red, green, and blue visible light, is emitted from the organic light emitting device 300, the color filter CF may improve the optical characteristics of the visible light.

A concave portion of the upper surface of the pixel electrode 310 corresponding to the via plug vp may reflect the external light incident through the color filter CF. The concave upper surface may reflect the external light in a substantially incident direction and emit the same to the outside through the color filter CF. Also, the concave portion of the upper surface of the pixel electrode 310 corresponding to the via plug vp may reflect the light emitted from the organic emission layer in the opposite direction and emit the same to the outside through the color filter CF.

As illustrated in FIG. 3, the via plug vp may be located at the upper left of the pixel electrode 310 in the second pixel PX2 when viewed in the vertical direction. In the first pixel PX1 and the third pixel PX3, the via plug vp may be located at the lower left of the pixel electrode 310 when viewed in the vertical direction. In the case of the second pixel PX2, the light reflected from the concave upper surface corresponding to the via plug vp may be emitted to the lower right when viewed in the vertical direction, and in the case of the first pixel PX1 and the third pixel PX3, the light reflected from the concave upper surface corresponding to the via plug vp may be emitted to the upper right when viewed in the vertical direction. Accordingly, the amount of light of a second color (e.g., green) emitted by the second pixel PX2 may increase in the lower right of the display apparatus, and the amount of light of first and third colors (e.g., red and blue) emitted by the first pixel PX1 and the third pixel PX3 may increase in the upper right of the display apparatus. A band of the second color (e.g., green) may occur in the lower right of the display apparatus, and a band of a color (e.g., purple) that is a mixture of the first color (e.g., red) and the third color (e.g., blue) may occur in the upper right of the display apparatus.

A concave portion may also be defined on the upper surface of the pixel electrode 310 corresponding to the protrusion pr. The concave portion corresponding to the protrusion pr on the upper surface of the pixel electrode 310 may also surround the central region CR. The concave upper surface corresponding to the protrusion pr may also reflect the external light or reflect the light emitted from the organic emission layer and may emit the light reflected from the concave upper surface corresponding to the protrusion pr to the outside through the color filter CF. As illustrated in FIG. 3, because the protrusion pr is arranged to surround the central region CR, the concave upper surface corresponding to the protrusions pr may also surround the central region CR. Accordingly, the concave upper surface corresponding to the via plug vp may reflect light in a particular direction, but the concave upper surface corresponding to the protrusion pr may reflect light in all horizontal directions. Accordingly, the light reflected from the concave upper surface corresponding to the protrusion pr may lower the ratio of the light reflected from the concave upper surface corresponding to the via plug vp in the entire light reflected from the pixel electrode 310 and may reduce the color band occurring around the display apparatus, and the user may not recognize the reduced color band.

Figure 5:
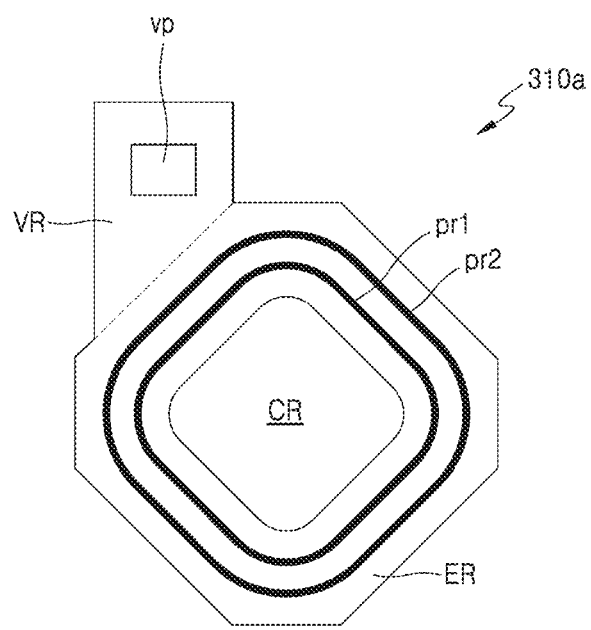
FIG. 5 is an enlarged schematic plan view of a portion of a pixel electrode of a display apparatus according to another embodiment.

FIG. 5 is an enlarged schematic plan view of a portion of a pixel electrode of a display apparatus according to another embodiment.

Referring to FIG. 5, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in a pixel electrode 310a. A protrusion protruding toward a substrate may be arranged in the peripheral region ER, and a recession may be arranged in the peripheral region ER corresponding to the protrusion in an organic insulating layer thereunder.

As illustrated in FIG. 5, the pixel electrode 310a may include a first protrusion pr1 having a ring shape surrounding the central region CR and a second protrusion pr2 having a ring shape surrounding the first protrusion pr1. The widths of the first protrusion pr1 and the second protrusion pr2 may be equal to each other. More concave portions may be arranged on the upper surface of the pixel electrode 310a corresponding to the first and second protrusions pr1 and pr2. Because the amount of light reflected in all directions from the concave upper surface corresponding to the first and second protrusions pr1 and pr2 becomes larger than the amount of light reflected in a particular direction from the concave upper surface corresponding to the via plug vp, the occurrence of a color band may be further reduced.

Figure 6A:
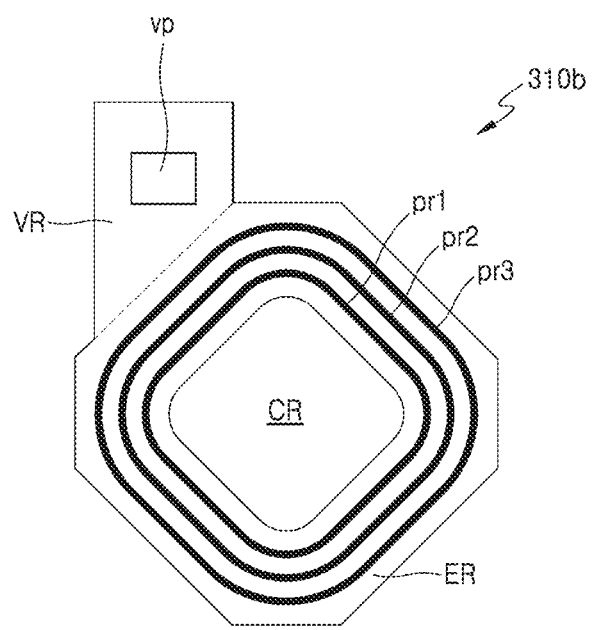
FIGS. 6A to 6C are enlarged schematic plan views of a portion of a pixel electrode of a display apparatus according to other embodiments.
Figure 6B:
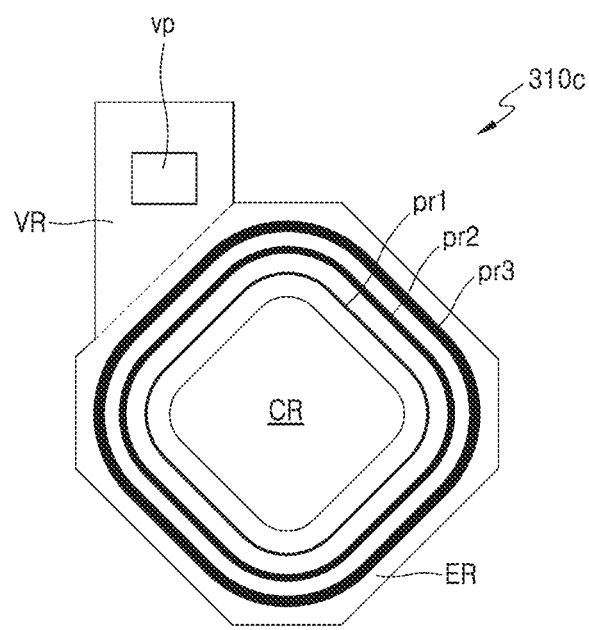
Figure 6C:
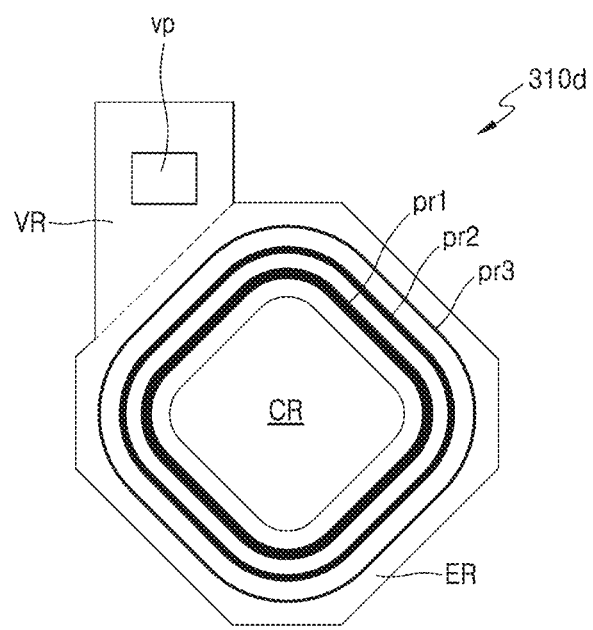

FIGS. 6A to 6C are enlarged schematic plan views of a portion of a pixel electrode of a display apparatus according to other embodiments.

Referring to FIG. 6A, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in a pixel electrode 310b. A protrusion protruding toward a substrate may be arranged in the peripheral region ER, and a recession may be arranged in the peripheral region ER corresponding to the protrusion in an organic insulating layer thereunder.

As illustrated in FIG. 6A, the pixel electrode 310b may include a first protrusion pr1 having a ring shape surrounding the central region CR, a second protrusion pr2 having a ring shape surrounding the first protrusion pr1, and a third protrusion pr3 having a ring shape surrounding the second protrusion pr2. The widths of the first to third protrusions pr1 to pr3 may be equal to each other. More concave portions may be arranged on the upper surface of the pixel electrode 310b corresponding to the first to third protrusions pr1 to pr3. Because the amount of light reflected in all directions from the concave upper surface corresponding to the first to third protrusions pr1 to pr3 becomes larger than the amount of light reflected in a particular direction from the concave upper surface corresponding to the via plug vp, the occurrence of a color band may be further reduced.

Referring to FIG. 6B, the widths of first to third protrusions pr1 to pr3 of a pixel electrode 310c may be different from each other. For example, the width of the first protrusion pr1 closest to the central region CR may be smallest, and the width of the third protrusion pr3 farthest from the central region CR may be largest. As such, because the width of the protrusions pr1 to pr3 decreases toward the central region CR, the amount of light reflected from the concave upper surface close to the central region CR may be relatively reduced.

Referring to FIG. 6C, the widths of first to third protrusions pr1 to pr3 of a pixel electrode 310d may be different from each other. For example, the width of the third protrusion pr3 farthest from the central region CR may be smallest, and the width of the first protrusion pr1 closest to the central region CR may be largest. As such, because the width of the protrusions pr1 to pr3 decreases away from the central region CR, the amount of light reflected from the concave upper surface close to the central region CR may be relatively increased.

Figure 7:
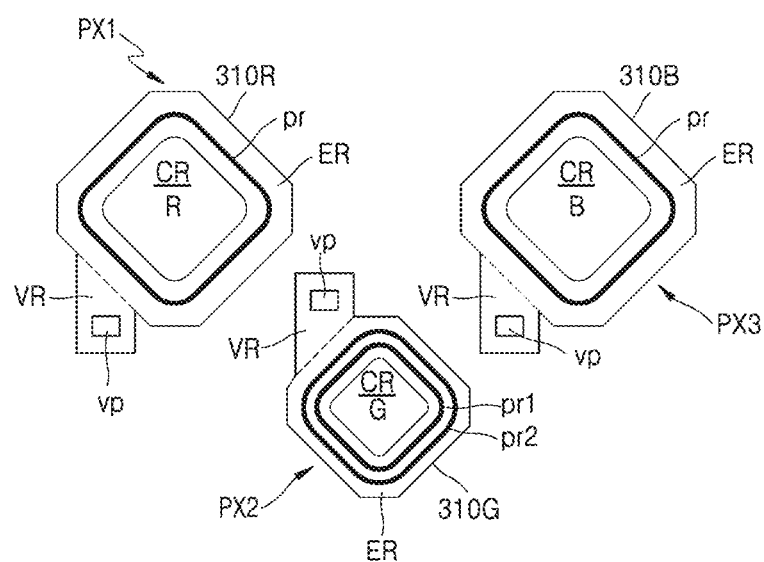
FIG. 7 is an enlarged schematic plan view of a portion of a plurality of pixel electrodes of a display apparatus according to another embodiment.

FIG. 7 is an enlarged schematic plan view of a portion of a plurality of pixel electrodes of a display apparatus according to another embodiment.

Referring to FIG. 7, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in pixel electrodes 310R, 310G, and 310B. A protrusion protruding toward a substrate may be arranged in the peripheral region ER, and a recession may be arranged in the peripheral region ER corresponding to the protrusion in an organic insulating layer thereunder.

The pixel electrode 310R of the first pixel PX1 and the pixel electrode 310B of the third pixel PX3 may include a protrusion pr having a ring shape surrounding the central region CR in the peripheral region ER as illustrated in FIG. 7. The pixel electrode 310B of the second pixel PX2 may include two protrusions pr1 and pr2 having a ring shape surrounding the central region CR in the peripheral region ER as illustrated in FIG. 7. Because the peripheral region ER of the second pixel PX2 is narrower than the peripheral region ER of the first pixel PX1 or the third pixel PX3, a variation in the amount of light reflected in the peripheral region ER of each of the pixels PX1, PX2, and PX3 may be reduced by arranging a larger number of protrusions pr1 and pr2 in the peripheral region ER of the second pixel PX2.

Although FIG. 7 illustrates that the pixel electrode 310R and the pixel electrode 310B each include one ring-shaped protrusion pr and the pixel electrode 310G includes two ring-shaped protrusions pr1 and pr2, this is merely an example and the number of ring-shaped protrusions may vary.

Figure 8:
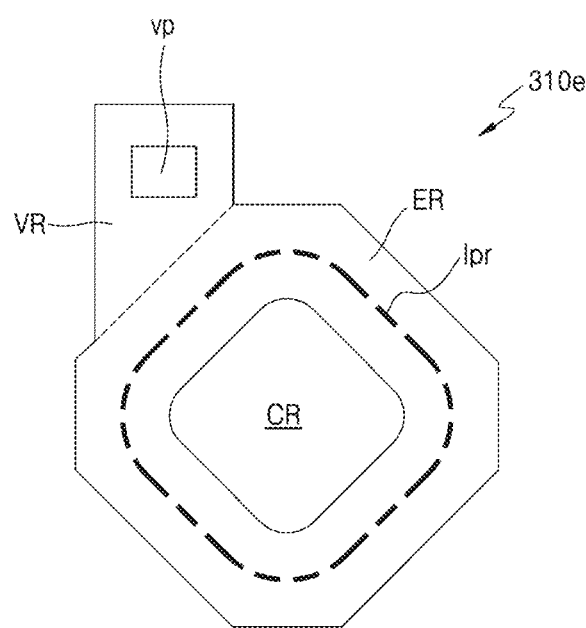
FIGS. 8 to 10 are enlarged schematic plan views of a portion of a pixel electrode of a display apparatus according to other embodiments.
Figure 9:
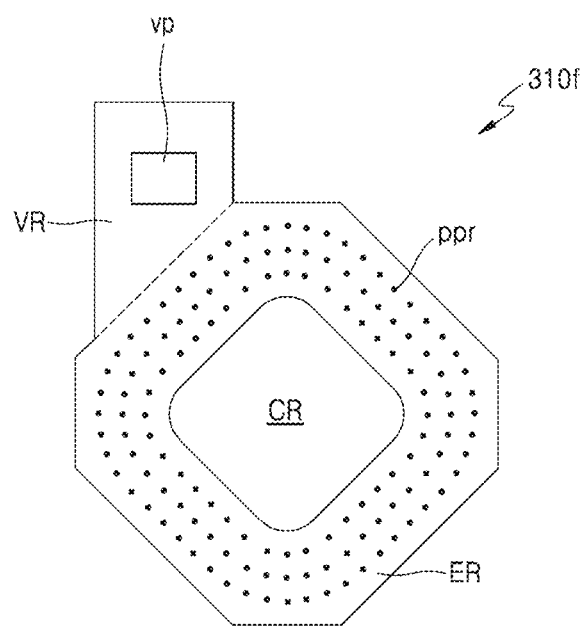
Figure 10:
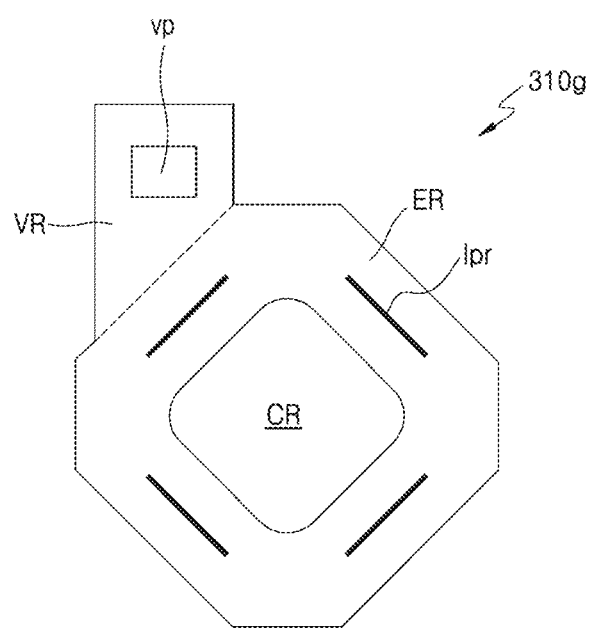

FIGS. 8 to 10 are enlarged schematic plan views of a portion of a pixel electrode of a display apparatus according to other embodiments.

Referring to FIG. 8, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in a pixel electrode 310e. A protrusion protruding toward a substrate may be arranged in the peripheral region ER, and a recession may be arranged in the peripheral region ER corresponding to the protrusion in an organic insulating layer thereunder.

The pixel electrode 310e may include line-type protrusions lpr arranged in the peripheral region ER as illustrated in FIG. 8. As illustrated in FIG. 8, the line-type protrusions lpr may be spaced apart from each other and may be arranged to substantially surround the central region CR. However, the disclosure according to the invention is not limited to this arrangement, and the line-type protrusions lpr may be arranged in various arrangements on the peripheral region ER.

Referring to FIG. 9, a pixel electrode 310f may include point-type protrusions ppr arranged in the peripheral region ER as illustrated in FIG. 9. As illustrated in FIG. 9, the point-type protrusions ppr may be spaced apart from each other and may be arranged to substantially surround the central region CR. However, the disclosure according to the invention is not limited to this arrangement, and the point-type protrusions ppr may be arranged in various arrangements on the peripheral region ER.

Referring to FIG. 10, a pixel electrode 310g may include four line-type protrusions lpr arranged in the peripheral region ER as illustrated in FIG. 10. The four line-type protrusions lpr may be arranged in a linear section of the peripheral region ER as illustrated in FIG. 10. However, the disclosure according to the invention is not limited to this arrangement, and the line-type protrusions lpr may be arranged in various arrangements on the peripheral region ER in another embodiment.

Figure 11:
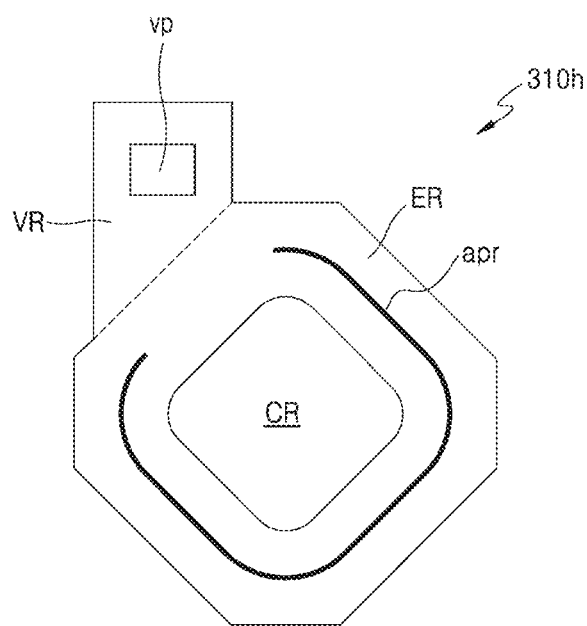
FIG. 11 is an enlarged schematic plan view of a portion of a pixel electrode of a display apparatus according to other embodiments.

FIG. 11 is an enlarged schematic plan view of a portion of a pixel electrode of a display apparatus according to other embodiments.

Referring to FIG. 11, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in a pixel electrode 310*h*. A protrusion protruding toward a substrate may be arranged in the peripheral region ER, and a recession may be arranged in the peripheral region ER corresponding to the protrusion in an organic insulating layer thereunder.

The pixel electrode 310*h* may include arc-type protrusions apr arranged in the peripheral region ER as illustrated in FIG. 11. The arc-type protrusions apr may partially surround the central region CR as illustrated in FIG. 11. As illustrated in FIG. 11, the arc-type protrusion apr may partially surround the central region CR except the direction toward the via plug vp. The arc-type protrusion apr may not be arranged between the via plug vp and the center of the central region CR.

The concave upper surface corresponding to the via plug vp may reflect light in a particular direction, whereas the arc-type protrusion apr may not be arranged in the direction toward the via plug vp and thus the concave upper surface corresponding to the arc-type protrusion apr may not reflect light in the particular direction. Thus, the direction of light reflected from the upper surface of the peripheral region ER and the connection region VR of the pixel electrode 310*h* may be uniform throughout.

Figure 12:
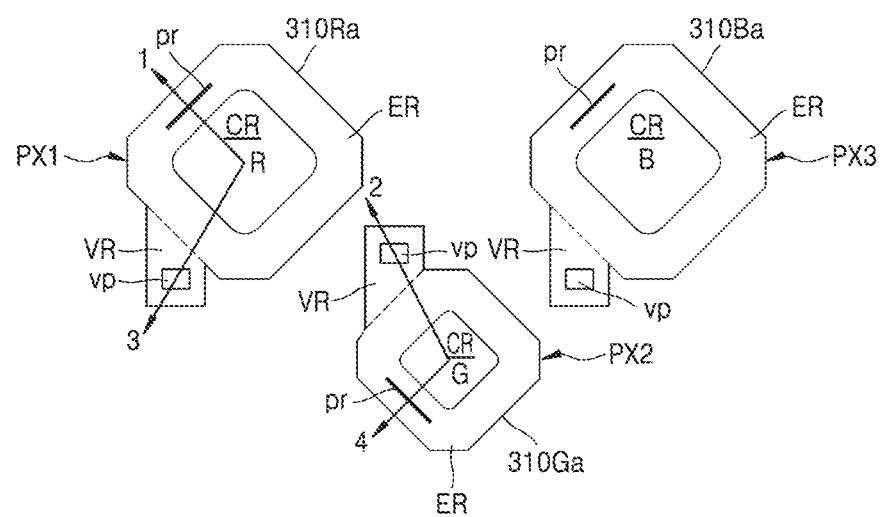
FIG. 12 is an enlarged schematic plan view of a portion of a plurality of pixel electrodes of a display apparatus according to another embodiment.

FIG. 12 is an enlarged schematic plan view of a portion of a plurality of pixel electrodes of a display apparatus according to another embodiment.

Referring to FIG. 12, a central region CR not covered by a pixel definition layer 113, a peripheral region ER surrounding the central region CR, and a connection region VR which is adjacent to the peripheral region ER and in which a via plug vp electrically connected to a thin film transistor is arranged may be defined in pixel electrodes 310Ra, 310Ga, and 310Ba. A protrusion protruding toward a substrate may be arranged in the peripheral region ER, and a recession may be arranged in the peripheral region ER corresponding to the protrusion in an organic insulating layer thereunder.

In the pixel electrode 310Ga of the second pixel PX2, the via plug vp may be located at the upper left of the pixel electrode 310Ga when viewed in the vertical direction (i.e., plan view). In the pixel electrode 310Ra of the first pixel PX1 and the pixel electrode 310Ba of the third pixel PX3, the via plug vp may be located at the lower left of the pixel electrode 310Ra and the pixel electrode 310Ba when viewed in the vertical direction. In the case of the second pixel PX2, the light reflected from the concave upper surface corresponding to the via plug vp may be emitted to the lower right when viewed in the vertical direction, and in the case of the first pixel PX1 and the third pixel PX3, the light reflected from the concave upper surface corresponding to the via plug vp may be emitted to the upper right when viewed in the vertical direction. Accordingly, the amount of light of a second color (e.g., green) emitted by the second pixel PX2 may increase in the lower right direction of the display apparatus, and the amount of light of first and third colors (e.g., red and blue) emitted by the first pixel PX1 and the third pixel PX3 may increase in the upper right direction of the display apparatus. A band of the second color (e.g., green) may occur in the lower right direction of the display apparatus, and a band of a color (e.g., purple) that is a mixture of the first color (e.g., red) and the third color (e.g., blue) may occur in the upper right direction of the display apparatus.

The pixel electrode 310Ra of the first pixel PX1 and the pixel electrode 310Ba of the third pixel PX3 may include a protrusion pr located in the peripheral region ER of the upper left of the central region CR as illustrated in FIG. 12. The direction from the center of the central region CR of the pixel electrodes 310Ra and 310Ba to the protrusion pr in the first and third pixels PX1 and PX3 respectively (the upper left direction in FIG. 12) may be substantially equal to the direction from the center of the central region CR of the pixel electrode 310Ga to the via plug vp in the second pixel PX2 (the upper left direction in FIG. 12). A concave portion may be defined at the upper left of the upper surface of the pixel electrodes 310Ra and 310Ba corresponding to the protrusion pr of the first and third pixels PX1 and PX3, respectively. Because the light of first and third colors reflected from the concave portion of the upper left is emitted in the lower right direction, the light of a second color reflected in the lower right direction from the concave upper surface corresponding to the via plug vp in the second pixel PX2 may be canceled.

The pixel electrode 310Ga of the second pixel PX2 may include a protrusion pr located in the peripheral region ER on the lower left of the central region CR as illustrated in FIG. 12. The direction from the center of the central region CR of the pixel electrode 310Ga to the protrusion pr in the second pixel PX2 (the lower left direction in FIG. 12) may be substantially equal to the direction from the center of the central region CR of the pixel electrodes 310Ra and 310Ba to the via plug vp in the first and third pixels PX1 and PX3 respectively (the lower left direction in FIG. 12). A concave portion may be defined at the lower left portion of the upper surface of the pixel electrodes 310Ga corresponding to the protrusion pr of the second pixel PX2. Because the light of a second color reflected from the concave portion of the lower left is emitted in the upper right direction, the light of first and third colors reflected in the lower right direction from the concave upper surface corresponding to the via plug vp in the first and third pixels PX1 and PX3 may be canceled. Accordingly, the color band occurring around the display apparatus may be reduced.

Although the disclosure has been described above with reference to the embodiments illustrated in the drawings, this is merely an example and those of ordinary skill in the art will understand that various modifications may be made therein. Thus, the spirit and scope of the disclosure should be defined by the appended claims.

The invention claimed is:
1. A display apparatus comprising:
a substrate;
a thin-film transistor on the substrate;
an organic insulating layer on the thin-film transistor;
a pixel electrode arranged on the organic insulating layer, and having a central region, a peripheral region surrounding the central region, and a connection region adjacent to and extending outward from the peripheral region, and wherein the pixel electrode includes a flat bottom surface disposed in an entirety of the central region, a protrusion arranged in the peripheral region and protruding toward the substrate and a via plug arranged in the connection region and electrically connected to the thin film transistor;
a pixel definition layer exposing and defining the entirety of the central region of the pixel electrode and overlapping the protrusion and the via plug;
an organic emission layer on the central region of the pixel electrode;
an opposite electrode on the organic emission layer and the pixel definition layer;
a thin film encapsulation layer on the opposite electrode;
a black matrix disposed on the thin film encapsulation layer and at least partially overlapping the via plug in a plan view; and
a color filter layer disposed on the thin film encapsulation layer and overlapping the central region and the protrusion in the plan view,
wherein the color filter partially overlaps the black matrix.

2. The display apparatus of claim 1, wherein a protrusion height of the protrusion is equal to or less than a protrusion height of the via plug.

3. The display apparatus of claim 1, wherein an upper surface of the pixel electrode corresponding to the protrusion is concave.

4. The display apparatus of claim 1, wherein the organic insulating layer includes a via hole penetrated by the via plug and a trench filled with the protrusion.

5. The display apparatus of claim 1, wherein the protrusion has a ring shape surrounding the central region.

6. The display apparatus of claim 1, wherein the protrusion includes a first protrusion having a ring shape surrounding the central region and a second protrusion having a ring shape surrounding the first protrusion.

7. The display apparatus of claim 6, wherein the protrusion further includes a third protrusion having a ring shape surrounding the second protrusion, and
a width of the second protrusion is between a width of the first protrusion and a width of the third protrusion.

8. The display apparatus of claim 1, wherein the protrusion includes a plurality of protrusions arranged in the peripheral region to be spaced apart from each other.

9. The display apparatus of claim 1, wherein the protrusion has an arc shape partially surrounding the central region, and
the protrusion having the arc shape is not arranged between the via plug and a center of the central region.

10. The display apparatus of claim 1, further comprising:
a thin film transistor layer including the thin film transistor and covered by the organic insulating layer;
wherein the pixel electrode includes a first pixel electrode and a second pixel electrode,
a first central region, a first peripheral region surrounding the first central region, and a first connection region adjacent to the first peripheral region are defined with respect to the first pixel electrode, the first pixel electrode includes a first protrusion arranged in the first peripheral region and protruding toward the substrate and a first via plug arranged in the first connection region and extending to the thin film transistor layer,
a second central region, a second peripheral region surrounding the second central region, and a second connection region adjacent to the second peripheral region are defined with respect to the second pixel electrode, and first pixel electrode includes a second protrusion arranged in the second peripheral region and protruding toward the substrate and a second via plug arranged in the second connection region and extending to the thin film transistor layer,
wherein a direction from a center of the central region of the first pixel electrode to the first protrusion is substantially the same as a direction from a center of the central region of the second pixel electrode to the second via plug, and
a direction from a center of the central region of the second pixel electrode to the second protrusion is substantially the same as a direction from a center of the central region of the first pixel electrode to the first via plug.

11. The display apparatus of claim 1, wherein the organic insulating layer includes a first organic insulating layer and a second organic insulating layer, the second organic insulating layer is located on the first organic insulating layer and penetrated by the via plug, and
the via plug is electrically connected to the thin film transistor through a connection electrode between the first organic insulating layer and the second organic insulating layer.

12. A display apparatus comprising:
a substrate;
a thin film transistor on the substrate;
an organic insulating layer covering the thin film transistor, and having a central region, a peripheral region surrounding the central region, and a connection region adjacent to and extending outward from the peripheral region, wherein the organic insulating layer defines a flat top surface disposed in an entirety of the central region, a recession arranged in the peripheral region and a via hole arranged in the connection region, and the via hole exposes a portion of an electrode electrically connected to the thin film transistor;
a pixel electrode arranged on the central region, the peripheral region, and the connection region of the organic insulating layer, the pixel electrode comprising a protrusion filling the recession and a via plug filling the via hole in the connection region, and the via plug is electrically connected to the thin film transistor;
a pixel definition layer exposing a central portion of the pixel electrode defining the entirety of the central region and overlapping the protrusion and the via plug;
an organic emission layer on the central region of the pixel electrode;
an opposite electrode on the organic emission layer and the pixel definition layer;
a thin film encapsulation layer on the opposite electrode;
a black matrix disposed on the thin film encapsulation layer and at least partially overlapping the via plug in a plan view; and
a color filter layer disposed on the thin film encapsulation layer and overlapping the central region and the protrusion in the plan view,
wherein the color filter partially overlaps the black matrix.

13. The display apparatus of claim 12, wherein a background region not overlapping the central region, the peripheral region, and the connection region in a plan view is further defined in the organic insulting layer, and
the pixel electrode does not overlap the background region in the plan view.

14. The display apparatus of claim 12, wherein the recession includes at least one trench having a ring shape surrounding the central region.

15. The display apparatus of claim 12, wherein the recession includes at least one trench having an arc shape partially surrounding the central region.

16. The display apparatus of claim 12, wherein a depth of the recession is less than a depth of the via hole.

\* \* \* \* \*